United States Patent
Neuman

(10) Patent No.: US 9,595,501 B1
(45) Date of Patent: Mar. 14, 2017

(54) WIRE BONDED ELECTRONIC DEVICES TO ROUND WIRE

(71) Applicant: AUTOMATED ASSEMBLY CORPORATION, Lakeville, MN (US)

(72) Inventor: Robert Neuman, Cannon Falls, MN (US)

(73) Assignee: Automated Assembly Corporation, Lakeville, MN (US)

(*) Notice: Subject to any disclaimer, the term of this patent is extended or adjusted under 35 U.S.C. 154(b) by 0 days.

(21) Appl. No.: 14/928,289

(22) Filed: Oct. 30, 2015

(51) Int. Cl.
*H01L 23/31* (2006.01)
*H01L 23/49* (2006.01)
(Continued)

(52) U.S. Cl.
CPC .......... *H01L 24/49* (2013.01); *H01L 21/4846* (2013.01); *H01L 21/563* (2013.01); *H01L 23/3135* (2013.01); *H01L 23/4985* (2013.01); *H01L 23/49883* (2013.01); *H01L 24/32* (2013.01); *H01L 24/73* (2013.01); *H01L 24/83* (2013.01); *H01L 24/85* (2013.01); *H01L 24/92* (2013.01); *H01L 33/486* (2013.01); *H01L 33/54* (2013.01); *H01L 33/62* (2013.01); *H05K 1/0313* (2013.01); *H05K 1/111* (2013.01); *H05K 1/181* (2013.01); *H05K 3/202* (2013.01); *H05K 3/305* (2013.01); *H05K 3/341* (2013.01); *H01L 2224/32225* (2013.01); *H01L 2224/48106* (2013.01); *H01L 2224/48225* (2013.01); *H01L 2224/73265* (2013.01); *H01L 2224/8385* (2013.01); *H01L 2224/85201* (2013.01); *H01L 2224/85801* (2013.01); *H01L 2224/92247* (2013.01); *H01L 2924/1205* (2013.01); *H01L 2924/1207* (2013.01); *H01L 2924/12041* (2013.01); *H01L 2933/005* (2013.01);
(Continued)

(58) Field of Classification Search
CPC ........ H01L 24/49; H01L 24/32; H01L 24/73; H01L 24/83; H01L 24/85; H01L 24/92; H01L 23/3135; H01L 23/4985; H01L 23/49883; H01L 33/486; H01L 33/54; H01L 33/62
See application file for complete search history.

(56) References Cited

U.S. PATENT DOCUMENTS 6,262,513 B1 * 7/2001 Furukawa ............... H01L 21/56
257/E21.502
6,822,340 B2   11/2004 Lamson
(Continued)

OTHER PUBLICATIONS

Lindblad et al., "Wire Bonded IC Components to Round Wire", U.S. Appl. No. 14/553,519, filed Nov. 25, 2014.

*Primary Examiner* — Ida M Soward
(74) *Attorney, Agent, or Firm* — Crawford Maunu PLLC

(57) ABSTRACT

A disclosed circuit arrangement includes a flexible substrate. A layer of pressure sensitive adhesive (PSA) is directly adhered to a first major surface of the substrate. One or more metal foil pads and electrically conductive wire are attached directly on a surface of the PSA layer. The wire has a round cross-section and one or more portions directly connected to the one or more metal foil pads with one or more weld joints, respectively. An electronic device is attached directly on the surface of the layer of PSA and is electrically connected to the one or more portions of the round wire by one or more bond wires, respectively.

13 Claims, 8 Drawing Sheets

(51) Int. Cl.
| | |
|---|---|
| *H01L 33/48* | (2010.01) |
| *H01L 33/54* | (2010.01) |
| *H01L 33/62* | (2010.01) |
| *H01L 23/00* | (2006.01) |
| *H05K 1/18* | (2006.01) |
| *H05K 3/30* | (2006.01) |
| *H05K 3/34* | (2006.01) |
| *H05K 1/11* | (2006.01) |
| *H05K 3/20* | (2006.01) |
| *H05K 1/03* | (2006.01) |
| *H01L 23/498* | (2006.01) |
| *H01L 21/56* | (2006.01) |
| *H01L 21/48* | (2006.01) |

(52) U.S. Cl.
CPC ........... *H01L 2933/0066* (2013.01); *H05K 2201/0137* (2013.01); *H05K 2201/0145* (2013.01); *H05K 2201/0154* (2013.01); *H05K 2201/05* (2013.01); *H05K 2201/10015* (2013.01); *H05K 2201/10022* (2013.01); *H05K 2201/10098* (2013.01); *H05K 2201/10106* (2013.01); *H05K 2201/10287* (2013.01); *H05K 2201/10977* (2013.01); *H05K 2203/1316* (2013.01)

(56) References Cited

U.S. PATENT DOCUMENTS

| | | | |
|---|---|---|---|
| 7,154,046 B2* | 12/2006 | Chung | B32B 37/203 174/254 |
| 7,875,504 B2 | 1/2011 | Silverbrook et al. | |
| 8,012,362 B2* | 9/2011 | Usui | H05K 9/0096 216/24 |
| 8,860,162 B2* | 10/2014 | Linderman | H01L 31/02008 257/432 |
| 9,196,958 B2* | 11/2015 | Arnold | H01Q 1/526 |
| 2002/0053735 A1* | 5/2002 | Neuhaus | H05K 3/325 257/728 |
| 2003/0122233 A1 | 7/2003 | Yagi et al. | |
| 2005/0128086 A1 | 6/2005 | Brown et al. | |
| 2005/0253286 A1* | 11/2005 | Yoshikawa | C08G 59/621 257/787 |
| 2008/0278793 A1* | 11/2008 | Tonar | B32B 17/06 359/267 |
| 2009/0261444 A1 | 10/2009 | Yamazaki et al. | |
| 2011/0064788 A1* | 3/2011 | Weimann | A61K 9/7084 424/449 |
| 2011/0169641 A1* | 7/2011 | Lin | H01L 23/48 340/572.8 |
| 2012/0126418 A1* | 5/2012 | Feng | H01L 21/563 257/774 |
| 2014/0036337 A1* | 2/2014 | Neuman | B60R 1/088 359/265 |
| 2014/0239509 A1* | 8/2014 | Kim | H01L 21/6835 257/774 |
| 2015/0229017 A1* | 8/2015 | Suzuki | H01P 5/107 333/26 |
| 2015/0344294 A1* | 12/2015 | Ghahremani | B81B 7/007 257/419 |

* cited by examiner

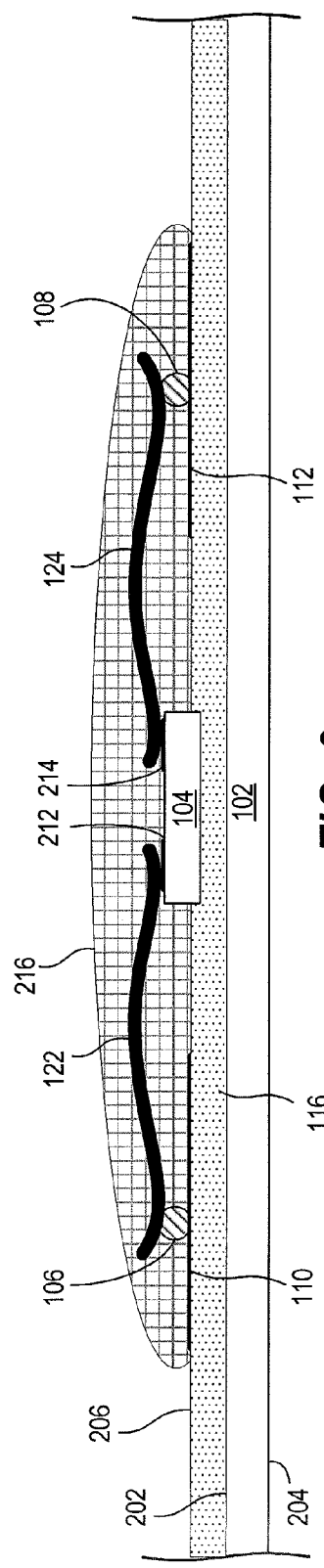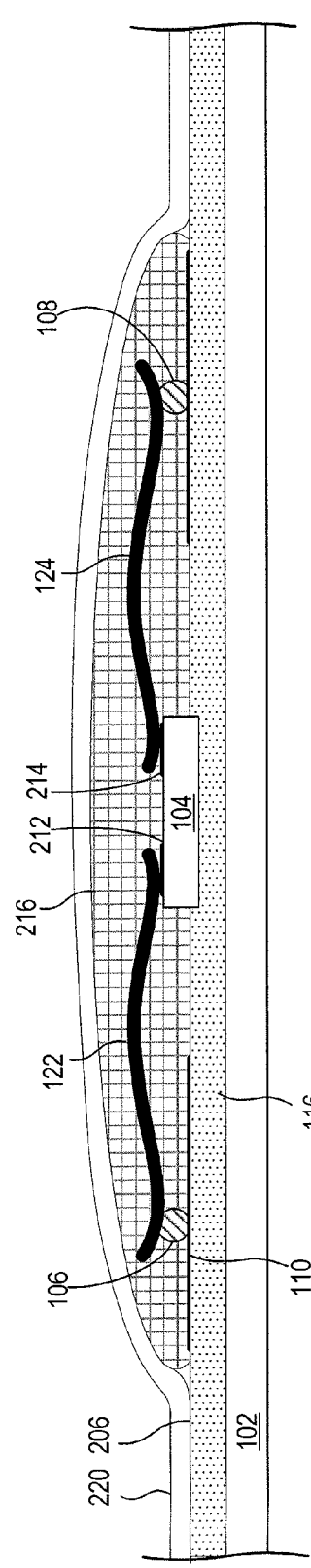

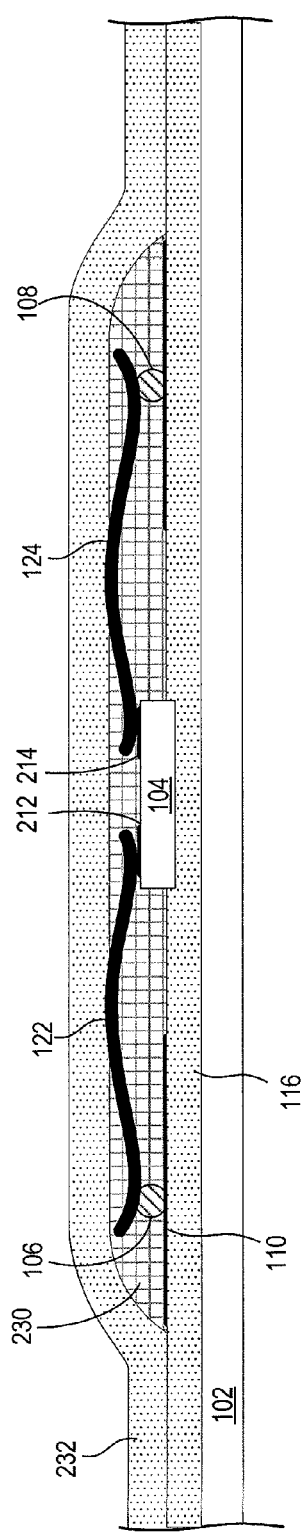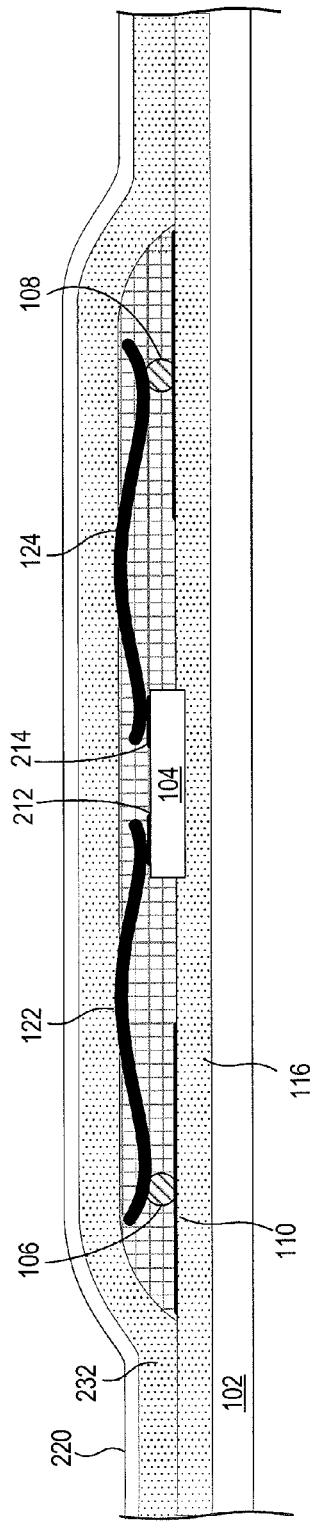

WIRE BONDED ELECTRONIC DEVICES TO ROUND WIRE

FIELD OF THE INVENTION

The disclosure describes wire bonding electronic devices to round wiring on a substrate.

BACKGROUND

There are a number of applications in which electronics are attached to various articles to provide a function that is ancillary to the function of the article or work in conjunction with the article to provide a desired function. Such applications may involve radio frequency (RF) transponders or light-emitting diodes (LEDs), for example.

A number of design objectives present challenges for making suitable structures to carrying the aforementioned electronic devices, and in some instances, compromises may be required. Examples of design objectives include low cost, low profile, flexibility, and durability.

Mounting electronic devices on flexible substrates is a common approach for making structures that are flexible and durable. However, approaches that involve print-and-etch processes may be more costly than desired. The expense is attributable in part to the print-and-etch processes used in creating the wiring pattern. Expensive chemicals are required for print-and-etch processes, and hazardous waste is a byproduct. Also, lead frames are often used as carriers for the electronic devices, creating a structure having a higher profile than may be desired.

SUMMARY

The above summary is not intended to describe each disclosed embodiment. The figures and detailed description that follow provide additional example embodiments.

In one embodiment, a circuit arrangement includes a flexible substrate having first and second major surfaces. The first major surface is opposite the second major surface. A first layer of pressure sensitive adhesive (PSA) has third and fourth major surfaces. The third major surface is opposite the fourth major surface, and the fourth major surface is directly adhered to the first major surface of the substrate. One or more metal foil pads are attached directly on the third major surface of the PSA layer. Electrically conductive wire is attached directly on the third major surface of the first layer of PSA. The wire has a round cross-section and one or more portions directly connected to the one or more metal foil pads with one or more weld joints, respectively. An electronic device is attached directly on the third major surface of the first layer of PSA and is electrically connected to the one or more portions of the round wire by one or more bond wires, respectively.

In another embodiment, a method of making a circuit arrangement includes attaching first and second metal foil pads to a flexible substrate by a first layer of pressure-sensitive adhesive (PSA) on the flexible substrate. An electronic device is attached to the substrate by the pressure-sensitive adhesive proximate the first and second metal foil pads. One or more wire segments of wire are attached to the substrate by the first layer of PSA. The one or more wire segments have a round cross section and first and second portions over the first and second metal foil pads, respectively. The first and second portions of the one or more wire segments are welded to the first and second metal foil pads, respectively. The electronic device is wire bonded to the first and second portions of the one or more wire segments, making first and second wire bond joints between first and second bond wires and the first and second portions of the one or more wire segments, respectively.

In another method of making a circuit arrangement, first and second metal foil pads are picked and placed on a flexible substrate. The first and second metal foil pads are attached to the substrate by a first layer of pressure-sensitive adhesive (PSA) on the flexible substrate. An electronic device is attached to the flexible substrate by the pressure-sensitive adhesive proximate the first and second metal foil pads. One or more wire segments of wire are attached to the substrate by the first layer of PSA. The one or more wire segments have round cross sections and first and second portions over the first and second metal foil pads, respectively. The first and second portions of the one or more wire segments are welded to the first and second metal foil pads, respectively. The electronic device is wire bonded to the first and second metal foil pads, making first and second wire bond joints between first and second bond wires and the first and second metal foil pads, respectively.

BRIEF DESCRIPTION OF THE DRAWINGS

Other aspects and advantages will become apparent upon review of the Detailed Description and upon reference to the drawings in which:

FIG. 2 shows a cross section of a portion of the RF transponder arrangement of FIG. 1 taken in direction 2;

FIG. 3 shows the structure of FIG. 2, with an added release liner;

FIG. 4 shows an alternative to the structure of FIG. 2;

FIG. 5 shows a release liner disposed directly on the second PSA layer;

DETAILED DESCRIPTION

Figure 1:
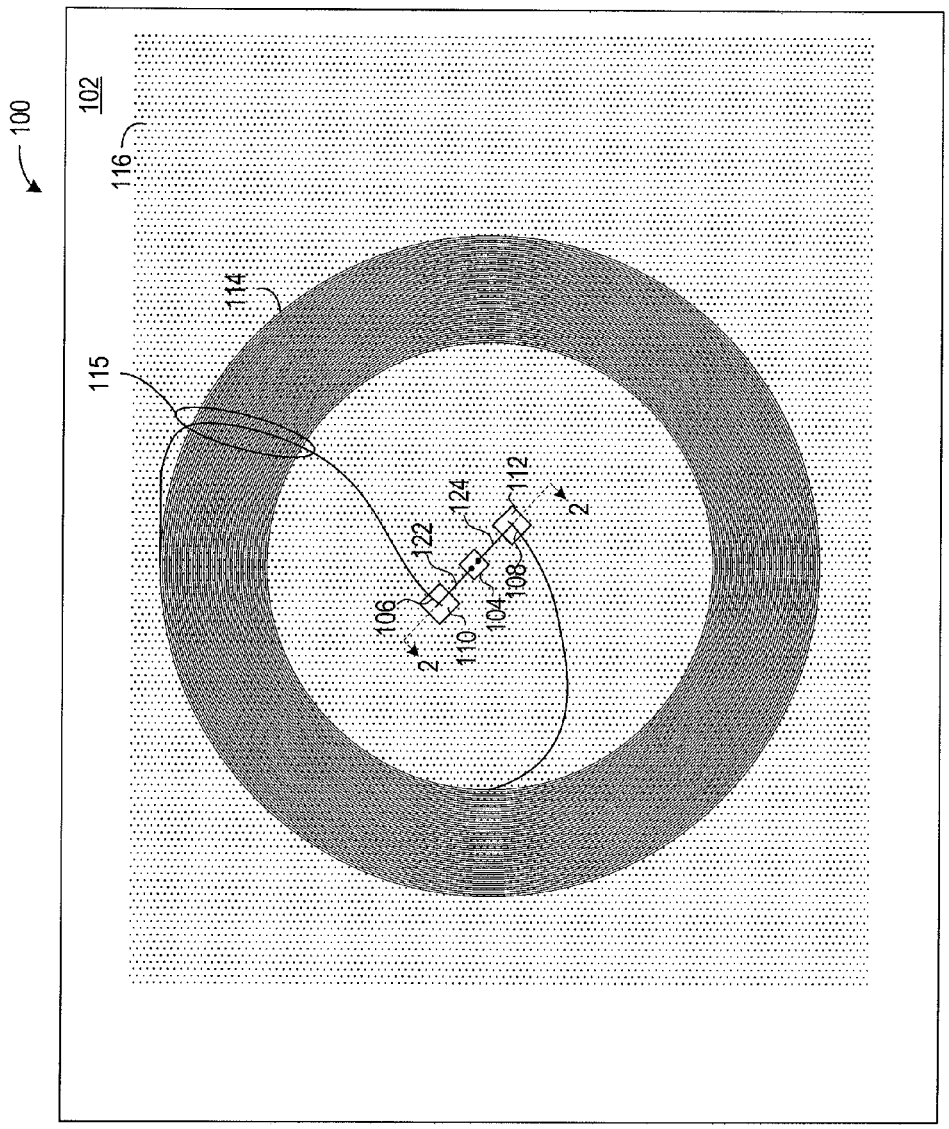
FIG. 1 shows an example of an RF transponder arrangement.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Terms such as over, under, top, bottom, above, below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

In the disclosed structures, RF transponder arrangements, LED-based lighting apparatuses, and other circuit arrangements of electronic devices are constructed using round wire rather than printed-and-etched patterns of conductive material for wiring the electronic devices. "Wire" as used herein does not refer to printed or printed-and-etched patterns of conductive material. Rather, as used herein, wire refers to one or more strands of conductive material that have been made, for example, by drawing the conductive material through draw plates. Using a fine gauge copper wire to make antennas or provide power to LEDs eliminates the use of environmentally hazardous chemicals as would be required for printing and etching. Though challenges are presented in connecting the wire to electronic devices such as RF transponders, LEDs, or discrete components, the disclosed approaches simplify making the connections. Electronic devices as used herein refers to integrated circuit (IC) components as well as to discrete components such as capacitors, resistors, etc.

The disclosed approaches provide low-cost, low-profile, flexible, and durable structures. The approaches simplify attachment of wiring to electronic devices such as RF transponders, LEDs, and discrete components, such as capacitors and resistors. An example of the disclosed circuit arrangements includes a flexible substrate and a layer of pressure sensitive adhesive (PSA) adhered to one of the surfaces of the flexible substrate. The flexible substrate may be any material that satisfies application requirements. Examples include polyimide, polyester, polyethylene terephthalate (PET), a polyelectrolyte multilayers (PEMs), paper, high-density polyethylene, and vinyl. Example types of pressure sensitive adhesives include acrylic, natural rubber, or synthetic rubber. The combination of features in the disclosed structures provides a substantial improvement in durability over previous structures. The disclosed structures have been tested to withstand hundreds of thousands of flexes, far surpassing prior art structures. The improved durability allows the structures to be deployed in new applications, such as those that include wearable devices.

Metal foil pads and one or more electronic devices are attached to the exposed surface of the PSA layer. The metal pads may be copper or aluminum, depending on application requirements. Electrically conductive wire is also attached to the exposed surface of the PSA layer. The wire has a round cross-section and portions of the wire are directly connected to the metal foil pads with weld joints.

The electronic device(s) are connected to the wire, either directly or indirectly, by bond wires. In a direct connection, one end of the bond wire is connected to the electronic device and the other end of the bond wire is connected to the portion of the wire that is connected to the metal foil pad. In an indirect connection, one end of the bond wire is connected to the electronic device, and the other end of the bond wire is connected to the metal foil pad.

Each metal foil pad serves as a connection site between the round wire and the electronic device, providing a stable surface to which the round wire and bond wires can be connected. Prior approaches have used lead frames to connect electronic devices to conductors. However, the lead frames introduce additional bulk to the structure, which may be undesirable for some applications. The metal foil pads eliminate the need for lead frames, thereby reducing the profile of the structure.

The structure having round wire attached to a flexible substrate by a PSA layer provides a substantial reduction in cost over structures having printed-and-etched wiring patterns. The structure is amenable to welding and wedge bonding, which eliminates environmental concerns associated with lead-based solders and costs and durability associated with lead-free solders. As described below, various aspects of the structure make the structure both flexible and durable.

FIG. 1 shows an example of an RF transponder arrangement 100. The RF transponder arrangement includes a substrate 102, an RF transponder 104, and coil antenna wire 114. The particular functions of the RF transponder are application dependent. Example applications include RFID and near-field communications. In general, the transponder modulates and demodulates an RF signal and processes information according to the application. The RF transponder may be packaged or unpackaged (a "bare die") according to application requirements. The substrate may be either rigid or flexible, also depending on application requirements. In one implementation, the substrate is a flexible substrate and is one of a polyethylene terephthalate (PET), a polyelectrolyte multilayers (PEMs), paper, a high-density polyethylene, or a vinyl, for example.

Rather than using expensive print-and-etch techniques to make antenna wiring for the RF transponder, wire may be glued to the substrate. The wire may be bare wire or wire encased in a dielectric jacket. The wire may be made of any material suitable for the application. The antenna wire 114 may be a fine gauge, round (round cross-section), bare wire. For example, 44 gauge (AWG) copper or silver-coated copper wire has been found to be suitable for some applications. However, different gauges may be suitable for different applications. For an implementation having bare antenna wire, an insulating bridge (not shown) may be disposed between intersecting portions 115 of the antenna wire.

The wire is glued to the surface of the substrate with a polymer adhesive 116. The adhesive may be pressure sensitive, which keeps the wire in place as the antenna pattern is formed on the substrate. It will be appreciated that other types of adhesives may be suitable for different applications. The RF transponder 104 may be attached to the substrate 102 using the same adhesive as is used for the antenna wire. In an example implementation, the wire and transponder may be applied to an adhesive layer as carried on adhesive transfer tape.

Metal foil pads 110 and 112 are attached to the substrate 102 by the adhesive 116 and located proximate the RF transponder 104. The distance separating each of pads 110 and 112 and the RF transponder is suitable for wire bonding of the RF transponder to the end portions of the antenna wire. The pads may be copper or aluminum and of a thickness suitable for wedge bonding and welding. In one implementation, the metal foil pads are 1 mm$^2$ and formed from 10 mil copper foil.

Antenna wire 114, which is a single coiled wire segment in the example, has portions for connecting to bond wires 122 and 124. In the coil antenna pattern, connections to the RF transponder are made at end portions 106 and 108 of the antenna wire. For other antenna patterns, the connection to the RF transponder may be at portions between the end portions of the antenna wire (e.g., FIG. 10). End portions 106 and 108 of the antenna wire are connected to pads 110 and 112 by weld joints. In one implementation, the end portions 106 and 108 are compressed against the pads 110 and 112 prior to welding, enhancing strength of the subsequently formed weld joint and forming a flat area of contact for wire bonding the antenna to the RF transponder.

FIG. 2 shows a cross section of a portion of the RF transponder arrangement 100 of FIG. 1 taken in direction 2. The flexible substrate 102 has a first major surface 202 and a second major surface 204 opposite the first major surface. One major surface of the PSA layer 116 is directly adhered to the first major surface 202 of the substrate.

RF transponder 104, metal foil pads 110 and 112 and the wire (FIG. 1, #114) are directly adhered to the major surface 206 of the PSA layer 116. It will be recognized that the portions of the wire 114 that are directly adhered to the PSA layer are not shown in FIG. 2 as the cross section shows only end portions 106 and 108 of the wire 114. The end portions 106 and 108 of the wire are connected to the metal foil pads 110 and 112, respectively, with weld joints. The weld joints may be formed by friction or ultrasonic welding, for example.

The RF transponder 104 is electrically connected to the portions 106 and 108 of the wire by bond wires 122 and 124, respectively. In the structure of FIG. 2, the bond wires are directly connected to the wire portions 106 and 108. Bond wire 122 connects bond pad 212 to wire portion 106, and bond wire 124 connects bond pad 214 to wire portion 108. Wedge bonding or ball bonding may be used to connect the bond wires, depending on application requirements and restrictions.

The metal foil pads 110 and 112 provide stable and visible structures that are dedicated to connecting the bond wires 122 and 124 to the wire portions 106 and 108. The metal foil pad 110 is only directly connected to wire portion 106, and metal foil pad 112 is only directly connected to wire portion 108.

A polymer conformal coating 216, which is sometimes referred to as a "glob-top," covers the RF transponder 104, bond wires 122 and 124, metal foil pads 110 and 112, and wire portions 106 and 108. The polymer conformal coating may be an epoxy, acrylic, polyurethane, or silicone, depending on application requirements. The transponder arrangement 100 of FIG. 1 does not show the polymer conformal coating in order to avoid obscuring elements of the arrangement.

FIG. 3 shows the structure of FIG. 2, with an added release liner 220. The release liner is disposed directly on the surface 206 of the PSA layer 116 and is separable from the PSA layer, which allows the RF transponder arrangement 100 (FIG. 1) to be attached to a desired object.

FIG. 4 shows an alternative to the structure of FIG. 2. Instead of a conformal coating 216 that covers the RF transponder 104 and bond wires, an underfill 230 fills the gaps between the bond wires and the PSA layer 116, covers the RF transponder 104 and metal foil pads 110 and 112 and partially covers the bond wires. The underfill may be a soft, flexible acrylic and provides a lower profile than the conformal coating 216.

In addition to the underfill, a second PSA layer 232 is disposed directly on the first PSA layer 116 and over the underfill and metal foil pads, bond wires, and RF transponder.

FIG. 5 shows a release liner 220 disposed directly on the second PSA layer.

In an alternative to the implementations of FIGS. 4 and 5, the underfill 230 may be omitted, and the second PSA layer retained. The resulting structures would be similar to the structures of FIGS. 4 and 5, but have no underfill. The second PSA layer in each alternative structure would conform more closely to metal foil pads 110 and 112, the bond wires 122 and 124, and the RF transponder 104.

Figure 6:
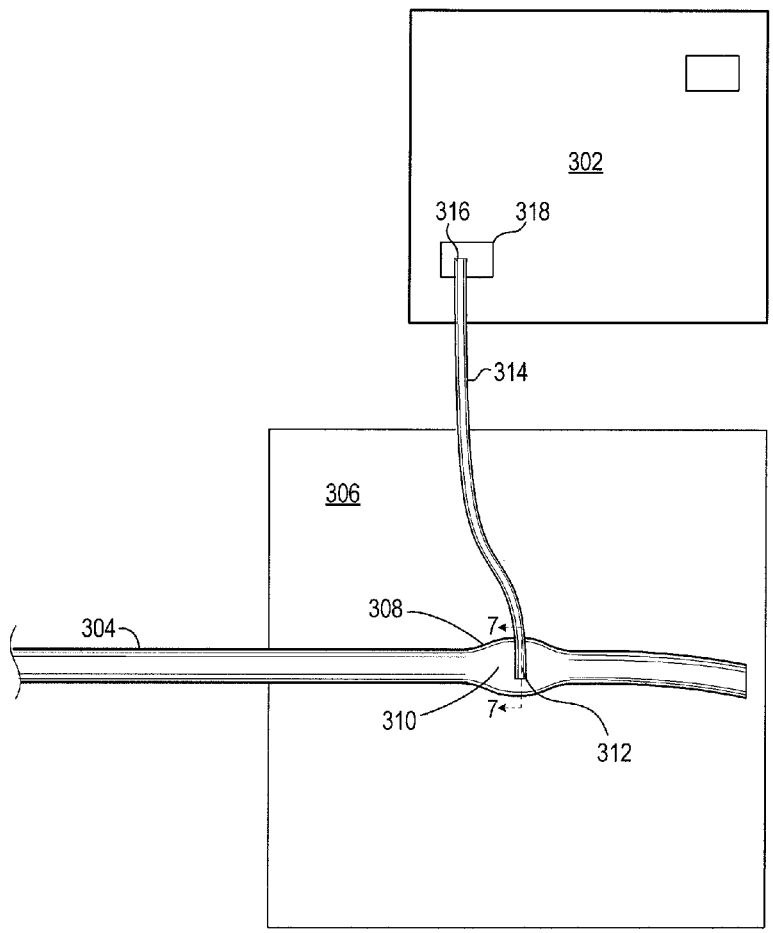
FIG. 6 shows a plan view of an electronic device wire bonded to a portion of round wire that is connected to a metal foil pad.

FIG. 6 shows a plan view of an electronic device 302 wire bonded to a portion of round wire 304 that is connected to a metal foil pad 306. The electronic device 302, wire 304, and metal foil pad 306 are representative of the RF transponder 104, wire 114, and metal foil pad 110 of FIG. 1, for example. In alternative applications, the portion of the electronic device may be an LED or discrete electronic component and the wire 304 may correspond to power or control wires.

A portion 308 of the wire 304 that is disposed on the metal foil pad 306 is compressed, forming a flat contact area 310 that is amenable to wire bonding. In addition to forming a contact area for wire bonding, compression of the intersection mechanically interlocks a portion of the wire 304 with the metal foil pad, thereby providing a stable target for welding the wire at the flat contact area 310 to the metal foil pad.

Once the wire 304 has been welded to the metal foil pad 306 at the flat contact area 310, the electronic device may be wire bonded to the flat contact area 310. One end 312 of the bond wire 314 is bonded to flat contact area 310, and the other end 316 of the bond wire is bonded to the contact pad 318 on the electronic device 302. The bond wire may be wedge bonded to provide a low profile. In other applications, the bond wires may be ball bonded. The weld joint of the flat contact area 310 to the metal foil pad 306 and the wire bond to the flat contact area 310 may be replicated for other portions of the wire 304 or for other portions of other wire segments.

Figure 7:
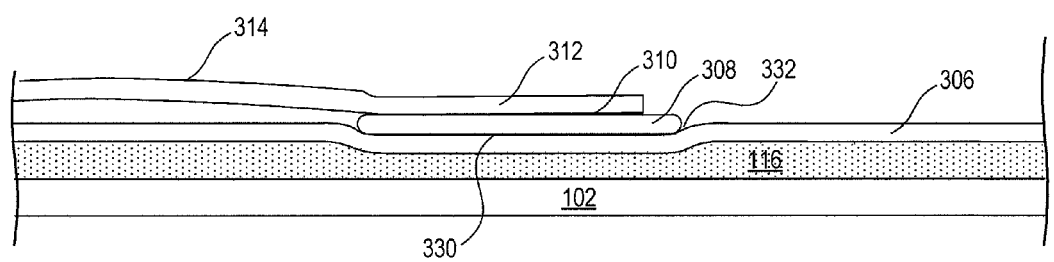
FIG. 7 shows a cross section of a portion of the structure of FIG. 6 taken in direction 7.

FIG. 7 shows a cross section of a portion of the structure of FIG. 6 taken in direction 7. The compressed portion 308 of the wire 304 does not have a round cross section as do other portions of the wire. Rather, the compressed portion has a first flat contact area 310 wire bonded to bond wire 314, and a second flat contact area 330 that is welded to the metal foil pad 306. Compression of wire portion 308 creates a recessed portion 332 in the metal foil pad 306. The compressed portion 308 within the recessed portion 332 provides a stable target for welding the wire to the metal foil pad, which might otherwise be problematic.

Figure 8:
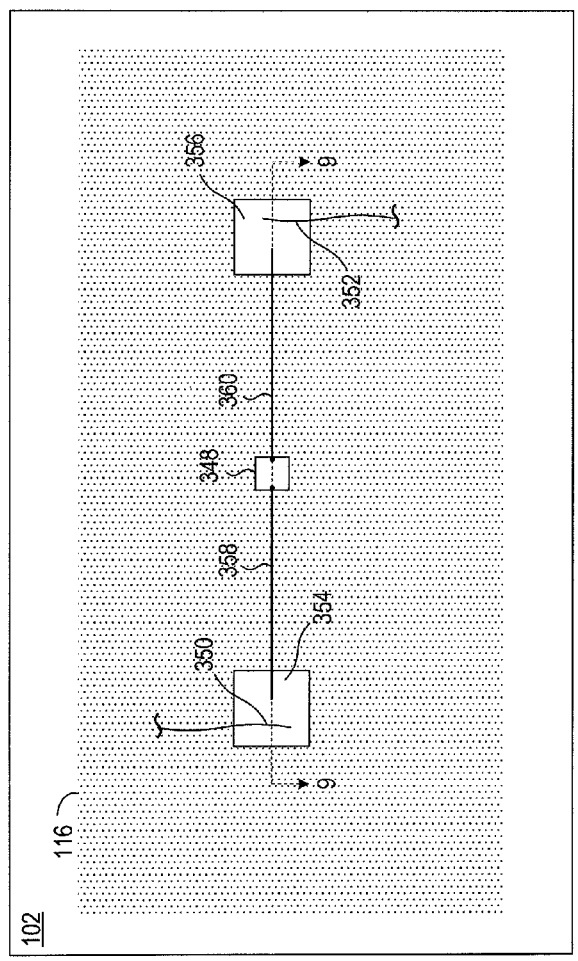
FIG. 8 shows a plan view of an alternative connection between an electronic device and round wire.

FIG. 8 shows a plan view of an alternative connection between an electronic device 348 and round wire. In the arrangement of FIG. 8, the bond wires are directly connected to the metal foil pads rather than to the round wire. Portions 350 and 352 of round wire are welded to metal foil pads 354 and 356, respectively. Bond wires 358 and 360 are wire bonded directly to the metal foil pads 354 and 356, respectively. Each metal foil pad is directly electrically connected to only a wire portion and to the bond wire. The indirect attachment of the bond wires to the wire portions 350 and 352 may be used in place of the direct attachment approaches shown in FIGS. 1-7 and FIGS. 10 and 11.

Figure 9:
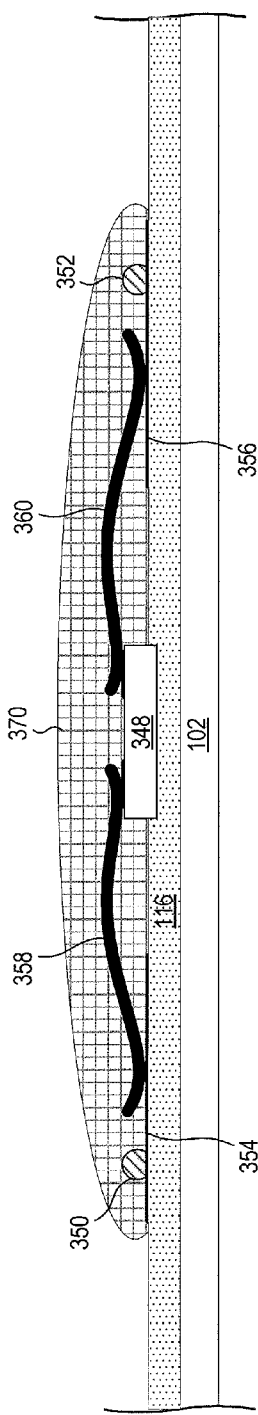
FIG. 9 shows a cross section of a portion of the structure of FIG. 8 taken in direction 9.

FIG. 9 shows a cross section of a portion of the structure of FIG. 8 taken in direction 9. Though a conformal coating 370 is shown similar to the conformal coating 216 of FIG. 2, an alternative implementation may have an underfill 230 and additional PSA layers 232 as in the structures of FIGS. 4 and 5. Alternatively, the underfill 230 may be omitted, and the second PSA layer retained. The resulting structure would be similar to either of the structures of FIGS. 4 and 5, but have no underfill. The second PSA layer in each alternative structure would conform closely to the electronic device 348, round wire portions 350 and 352, wire metal foil pads 354 and 356, the bond wires 358 and 360, and the RF transponder 104.

Figure 10:
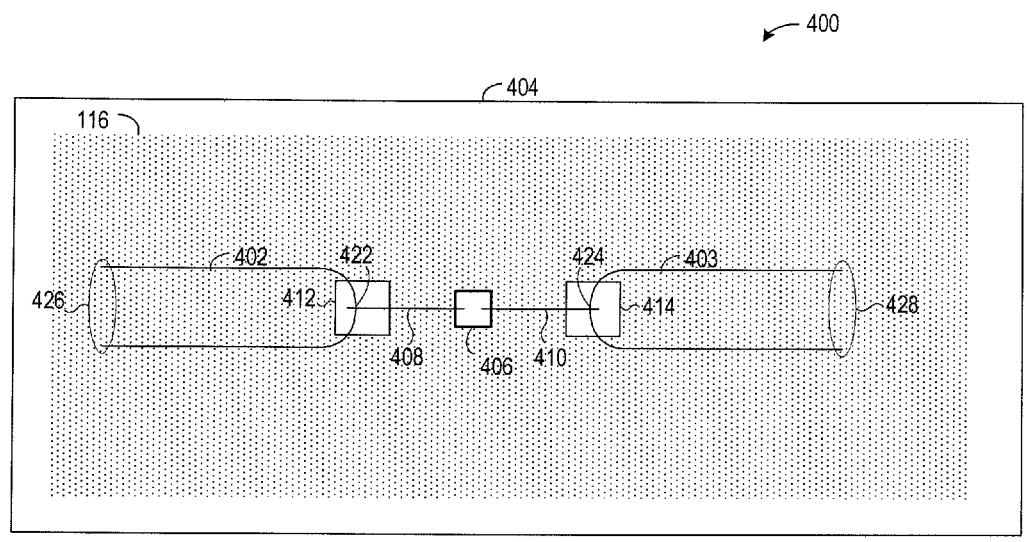
FIG. 10 shows an alternative antenna pattern and the connection of the antenna wires to the bond wires.

FIG. 10 shows an alternative antenna pattern and the connection of the antenna wires to the bond wires. The antenna pattern includes wire segments 402 and 403 and having the wire bonds at portions of the antenna wire that are between end portions of the antenna wire. It will be appreciated that in addition to the antenna patterns of FIGS. 1 and 10, the disclosed structures are adaptable for any of the many different antenna patterns known in the art to be suitable for RF transponder applications. As with the RF transponder arrangement 100 of FIG. 1, RF transponder arrangement 400 includes a substrate 404 and an RF transponder 406. The antenna and RF transponder may be adhered to the substrate as described for the RF transponder arrangement 100.

Metal foil pads 412 and 414 are attached to the substrate 404 by PSA layer 116 and located proximate the RF transponder 406. Portions 422 and 424, which are between the end portions 426 and 428 of wire segments 402 and 403, are laid over the metal foil pads 412 and 414, respectively. The wire portions 422 and 424 are compressed as described above. The bond wires 408 and 410 connect the RF transponder 406 to flat contact areas (e.g., FIGS. 6, 7) at portions 422 and 424 of the wire segments 402 and 403.

Figure 11:
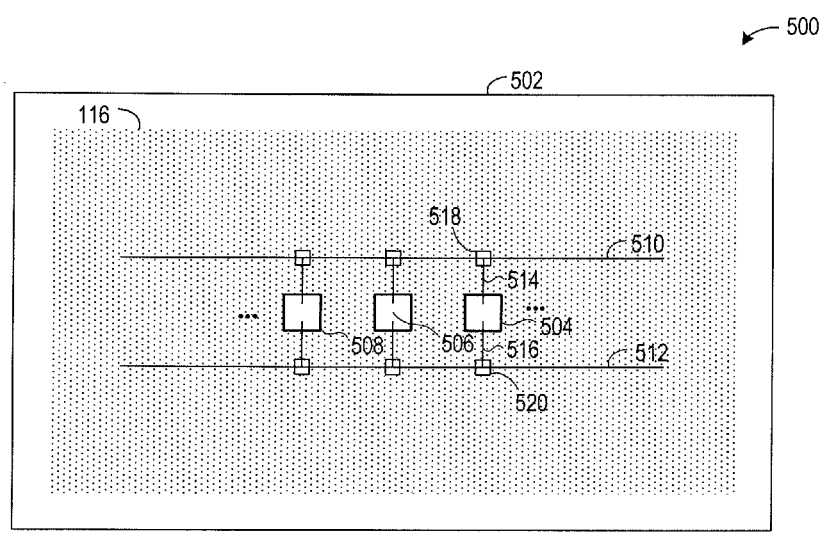
FIG. 11 shows an LED-based lighting arrangement having wire bonds from the LEDs to power wires welded to metal foil pads.

FIG. 11 shows an LED-based lighting arrangement 500 having wire bonds from the LEDs to power wires welded to metal foil pads. The lighting arrangement includes a substrate 502, such as that described above, along with LEDs 504, 506, and 508 and power wires 510 and 512 that are attached to the substrate. The LEDs may be bare dice or packaged dice. Additional control wires (not shown) may be attached to the substrate and connected to the LEDs in a manner similar to the manner in which the power wires are connected to the LEDs. The type of wire used for the power wires 510 and 512 may be the same as the type of wire used for the antenna wire 114 of FIG. 1. Also, the power wires and LEDs may be attached to the substrate using an adhesive layer as described above for the RF transponder arrangement.

LEDs 504, 506, and 508 are connected to the power wires 510 and 512 by respective pairs of bond wires wire bonded to metal foil pads. For example, bond wires 514 and 516 connect LED 504 to the power wires 510 and 512, respectively, on metal foil pads 518 and 520. The connections are similar to the connections described above for the RF transponder arrangement 100 and connections illustrated in FIGS. 2-9. Though not shown, it will be recognized that current regulating circuits, such as resistors, may be connected between the power wiring and the LEDs.

Figure 12:
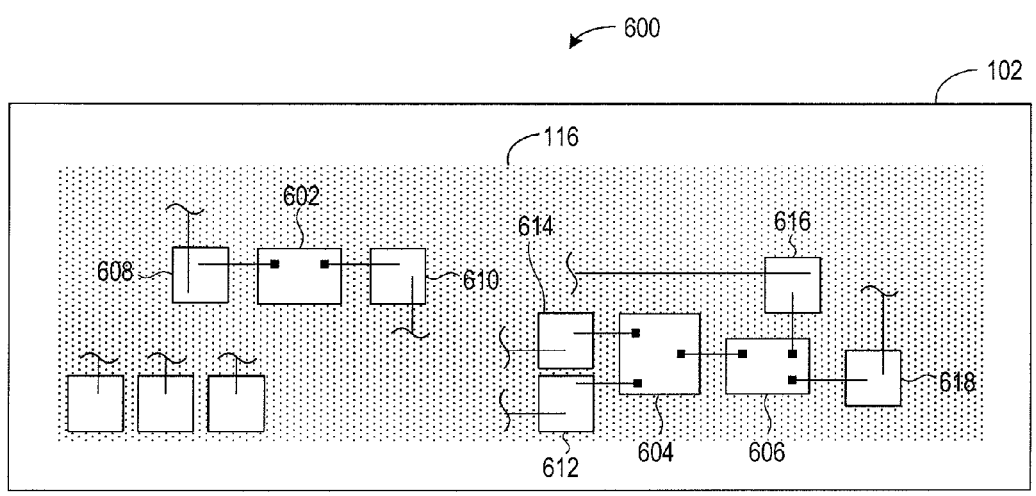
FIG. 12 shows a circuit arrangement in which multiple electronic devices may be wire bonded to multiple metal foil pads, in combination with a pair of the electronic devices being wire bonded to one another.

FIG. 12 shows a circuit arrangement 600 in which multiple electronic devices 602, 604, and 606 may be wire bonded to multiple metal foil pads 608, 610, 612, 614, 616, and 618, in combination with a pair 604 and 606 of the electronic devices being wire bonded one to another. The wire bond connections may be as shown and described above.

Figure 13:
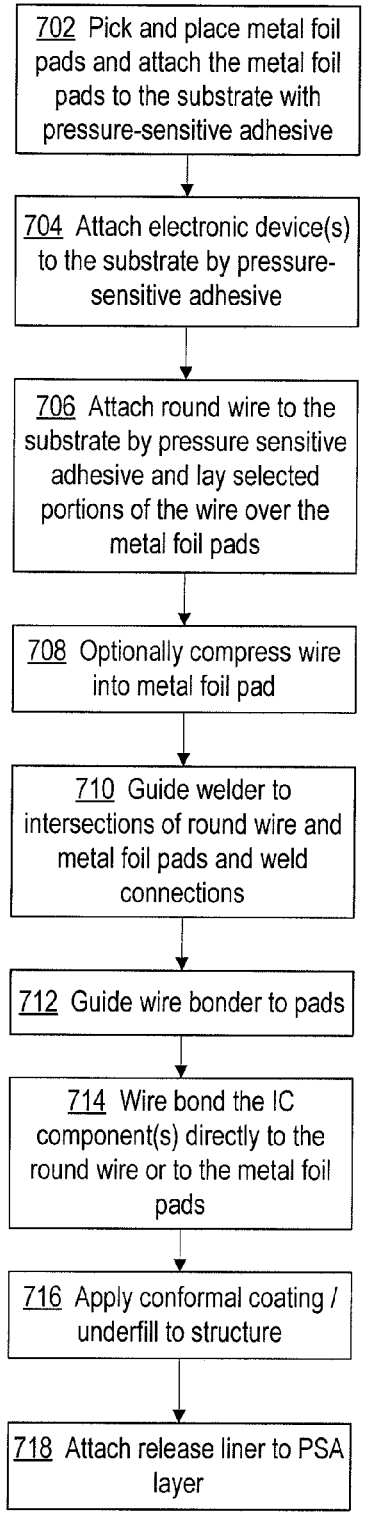
FIG. 13 is a flowchart of a process of making a circuit arrangement having an electronic device using wire bonding approaches to connect the electronic devices to round wire segments.

FIG. 13 is a flowchart of a process of making a circuit arrangement having an electronic device using wire bonding approaches to connect the electronic devices to round wire segments. Metal foil pads are picked and adhered to the PSA layer at desired locations at block 702. One or more electronic devices are picked and adhered to the PSA layer at desired locations at block 704. The locations of the metal foil pads and electronic device(s) are according to application requirements. The substrate, PSA layer, metal foil pads, electronic device(s), and bond wire are as described above. The metal foil pads and electronic devices may be picked and placed on the PSA layer using known robotic equipment.

At block 706, one or more round wire segments are attached to the substrate with the PSA. Selected portions of the round wire segment(s) pass over the metal foil pads. The wire segment(s) may implement a desired antenna pattern for an RF transponder or power and control wires for LEDs. The type of wire may be as described above.

At block 708, the portions of the wire segment(s) and the cross wires may be optionally compressed to form flat contact areas for wire bonding and create a stable target for welding the wire portions to the metal foil pads. In an example approach, the round wire portions may be compressed by robotic action. A robot may have an image sensor and processor for identifying portions of the wire that overlay the pads. Based on the imagery, a head unit may be positioned above a portion of the wire to be compressed. The head unit may include a pneumatically actuated piston having a cross section that is approximately the size of the diameter of the round wire. Once in position and at the desired height, the piston is driven by pneumatic force in a hammer action at the joint. The striking of the piston against the round wire portion forms a flat contact area for wire bonding and presses the flattened portion of the wire into a recess thereby formed in the metal foil pad.

At block 710, the compressed portions are welded to the metal foil pads. In one approach, the joints may be welded using an ultrasonic welder that is guided by digital imagery and robotic control.

The wire bonding head of a wire bonder is guided to the metal foil pads at block 712. The wire bonder may be imagery-based, using images of the metal foil pads and wire portions to position the wire bonding head. At block 714, the electronic device is electrically connected to round wire, either directly by a wire bond connection on the flat contact areas of the wire portions, or indirectly by a wire bond connection on the metal foil pad. The bond wires may be wedge bonded or ball bonded, depending on application requirements. In implementations in which insulated wire is used, the welding and wedge bonding at the intersections of the cross wires and wire segments effectively removes the dielectric material at the joints. Though blocks 702-714 are presented in a particular order, it will be recognized that the order of processing may vary according to implementation requirements.

At block 716, a conformal coating or an underfill is applied to the wire bonded circuit arrangement. The conformal coating may be as described above with reference to FIG. 2 and covers the metal foil pads, bond wires, and electronic device. A lower profile and flexible structure may be made by applying an acrylic underfill to the structure. The underfill is flexible, fills the gap between the bond wires and the PSA layer and covers the wire bond joints. If an underfill is used in the structure, a second PSA layer may be disposed over the first PSA layer and covering the electronic device, bond wires, round wire, and metal foil pads. A release liner is attached to the PSA layer at block 718.

Although the figures illustrate circuit arrangements that include RF transponders and LEDs, it will be recognized that the disclosed approaches for wire bonding to round wire are similarly applicable to other electronic devices, such as other integrated circuit (IC) components or discrete components such as capacitors, resistors, etc.

The present invention is thought to be applicable to a variety of applications. Other aspects and embodiments will be apparent to those skilled in the art from consideration of the specification and practice of the circuits and methods disclosed herein. It is intended that the specification and illustrated embodiments be considered as examples only, with a true scope of the invention being indicated by the following claims.

What is claimed is:

1. A circuit arrangement, comprising:
   a flexible substrate having first and second major surfaces, the first major surface opposite the second major surface;
   a first layer of pressure sensitive adhesive (PSA) having a third major surface and a fourth major surface, the third major surface opposite the fourth major surface, and the fourth major surface directly adhered to the first major surface of the flexible substrate;
   one or more metal foil pads attached directly on the third major surface of the first layer of PSA layer;
   electrically conductive round wire attached directly on the third major surface of the first layer of PSA, the wire having a round cross-section and one or more portions directly connected to the one or more metal foil pads with one or more weld joints, respectively; and
   an electronic device attached directly on the third major surface of the first layer of PSA and electrically connected to the one or more portions of the round wire by one or more bond wires, respectively.

2. The circuit arrangement of claim 1, wherein the one or more bond wires are directly connected to the one or more portions of the round wire.

3. The circuit arrangement of claim 1, wherein the one or more bond wires are directly connected to the one or more metal foil pads, respectively.

4. The circuit arrangement of claim 1, wherein each of the one or more portions of round wire have flat contact areas with the respective one of the one or more metal foil pads.

5. The circuit arrangement of claim 1, wherein:
   each of the one or more portions of round wire has a flat area of contact with the respective one of the one or more metal foil pads; and
   each of the one or more portions of round wire has a flat area of contact to which the respective one of the one or more bond wires is directly connected.

6. The circuit arrangement of claim 1, wherein each of the one or more metal foil pads is directly electrically connected to only one of the one or more portions of round wire.

7. The circuit arrangement of claim 1, wherein each of the one or more metal foil pads is directly electrically connected to only one of the one or more portions of round wire and one of the one or more bond wires.

8. The circuit arrangement of claim 1, wherein the electronic device is one of an RF transponder, an LED, or a discrete component.

9. The circuit arrangement of claim 1, further comprising a polymer conformal coating that covers the one or more metal foil pads and the electronic device.

10. The circuit arrangement of claim 9, further comprising a release liner disposed directly on the first layer of PSA.

11. The circuit arrangement of claim 1, further comprising:
    a flexible underfill that fills gaps between the one or more bond wires and the third major surface of the first layer of PSA;
    a second layer of PSA disposed directly on the first layer of PSA and over the one or more metal foil pads, one or more bond wires, and the electronic device; and
    a release liner disposed directly on the second layer of PSA.

12. The circuit arrangement of claim 1, further comprising:
    a second layer of PSA disposed directly on the first layer of PSA and over the one or more metal foil pads, one or more bond wires, and the electronic device; and
    a release liner disposed directly on the second layer of PSA.

13. The circuit arrangement of claim 1, wherein the flexible substrate is one of a polyimide, polyester, polyethylene terephthalate (PET), a polyelectrolyte multilayers (PEMs), paper, a high-density polyethylene, or a vinyl.

* * * * *